United States Patent [19]

Rosenberg

[11] 3,852,074

[45] Dec. 3, 1974

[54] PHOTOPOLYMERIZABLE COMPOSITIONS CONTAINING ORGANIC NOBLE METAL COMPOUNDS

[75] Inventor: Richard M. Rosenberg, Wilmington, Del.

[73] Assignee: E. I. du Pont de Nemours and Company, Wilmington, Del.

[22] Filed: May 22, 1972

[21] Appl. No.: 255,816

Related U.S. Application Data

[63] Continuation-in-part of Ser. No. 25,236, April 2, 1970, abandoned.

[52] U.S. Cl. .................... 96/115 P, 96/34, 96/35.1

[51] Int. Cl. .................... G03c 1/68

[58] Field of Search .................... 96/115 P, 35.1, 34; 204/159.24, 159.23

[56] References Cited

UNITED STATES PATENTS

| | | | |
|---|---|---|---|
| 2,791,504 | 5/1957 | Plambeck | 96/115 X |
| 3,547,651 | 12/1970 | Roos | 96/115 |
| 3,615,457 | 10/1971 | Seibert et al. | 96/35.1 |

*Primary Examiner*—Ronald H. Smith

[57] ABSTRACT

The photopolymerizable compositions contain organic noble metal compounds, photopolymerizable compounds, organic sensitizers, and optionally, organosulfur compounds, a flux and a polymeric ester. An important feature of this invention resides in the use of particular photopolymerizable compounds which must contain at least 50 percent of a polyfunctional acrylate derived from a polyol in which the hydroxyl groups are separated by at least three atoms. The process comprises applying these novel compositions to substrates and exposing the films to ultraviolet energy of the proper wave length through masks. This causes the exposed portions of the film to harden, and thereafter, the unhardened portions of the films are removed with a suitable solvent. Then the entire assembly is fired to produce high yields of fine line noble metal patterns having high resolution.

10 Claims, No Drawings

PHOTOPOLYMERIZABLE COMPOSITIONS CONTAINING ORGANIC NOBLE METAL COMPOUNDS

CROSS REFERENCE TO RELATED APPLICATION

This application is a continuation-in-part of U.S. application Ser. No. 25,236 filed on Apr. 2, 1970 and now abandoned.

BACKGROUND OF THE INVENTION

Generally, there are three methods for producing electrically conductive or resistive patterns on various types of substrates. These include:

1. thick film techniques wherein a metallizing composition is screen printed in the desired pattern onto a substrate and subsequently fired to produce lines having a thickness within the range of 3–125 microns with line resolution usually being no better than 2 mils;

2. thin film techniques wherein metals are evaporated or sputtered onto a substrate in vacuum and a pattern is defined by a mechanical mask overlaying the substrate. In a variant of this technique the substrate is coated with a photoresist, a pattern is defined by exposure of the photoresist through a mask to a proper wave length light with subsequent development or washing away of the unexposed photoresist. Evaporation or sputtering is then carried out in vacuum and followed by stripping away the remaining photoresist. These films are usually less than 1 micron thick with line resolution better than 1 mil.

3. thin film photoetching techniques wherein a substrate is coated with a film of metal by evaporation or sputtering in vacuum and a pattern is defined on the film by a photoresist in the manner described above. The exposed metal is etched away and the remaining resist is stripped. The films are usually less than 1 micron thick with line resolution better than 1 mil.

Recently, U.S. Pat. No. 3,615,457 issued to Seibert and Vaughan on October 26, 1971 described a novel process for defining metallic patterns through the use of photopolymerizable compositions containing organometallics and photopolymerizable compounds. These compositions are applied to ceramic substrates and exposed to ultraviolet light through negative masks. Subsequent washing selectively removes the unexposed film portions and firing converts the remaining film pattern to an adherent metallization. Film thickness is usually less than 1 micron with line resolution of about 1 mil or more. This method combines the simplicity of thick film technology with the line resolution capabilities of thin film technology.

The present invention relates to an improvement over the Seibert and Vaughan discovery by providing: (1) the formation of a more suitable polymer network which results in shorter exposure times to ultraviolet light which ultimately produces highly resolved metal patterns (i.e., better than 0.5 mil line width resolution) and (2) an optimized polymer network which prevents wash-out of the organometallic compounds during the development stage, thereby increasing yield.

SUMMARY OF THE INVENTION

This invention relates to photopolymerizable compositions for producing high yields of highly resolved noble metal patterns comprising an organic solvent having constituents dissolved therein, wherein the constituents comprise:

a. 5–85 percent, by weight, of an organic noble metal compound;

b. 5–30 percent, by weight, of a photopolymerizable compound(s) containing at least 50 percent of a polyfunctional acrylate derived from a polyol in which the hydroxyl groups are separated by at least three atoms;

c. 0.5–10 percent, by weight, of an organic sensitizer;

d. 0–60 percent, by weight, of organosulfur compound(s);

e. 0–50 percent, by weight, of a flux; and f. 0–15 percent, by weight, of a polymeric ester. The process of this invention comprises:

1. applying the above photopolymerizable composition onto a substrate to form a film and drying the film; and optionally, pre-exposing the film to ultraviolet light for a short period of time;

2. placing a mask having a desired pattern over the film;

3. exposing the masked film to ultraviolet light for a sufficient period of time to harden a desired pattern of the film;

4. developing the desired pattern by contacting a suitable solvent with the film whereby the undesired, unhardened portions of the film are washed away; and 5. drying the developed pattern and firing the coated substrate at a temperature within the range of 500°–1000°C.

DESCRIPTION OF THE PREFERRED EMBODIMENTS

The photopolymerizable compositions of this invention can comprise six kinds of ingredients with three being required. The first ingredient is an organic noble metal compound which comprises from 5–85 percent by weight of the solids content of the polymerizable composition; a preferred range is 10–50 percent. The organic noble metal compound may be any of the well-known compounds, used in decorating compositions (e.g., liquid bright gold) or in electronic metallizing compositions. These include noble metal resinates, noble metal cyclic terpene mercaptides, noble metal tertiary mercaptides, etc. Some of the more common noble metal organic compounds have been described in U.S. Pat. Nos. 2,490,399; 2,994,614 and 3,268,568. Specific exemplary compounds include the pinene mercaptides of platinum, palladium, gold, silver ruthenium, rhodium, osmium and iridium. Many noble metal compounds containing at least one carbon-metal bond of various types, such as those discussed in "Organometallic Compounds," Vol. II, Coates, Green and Wade, Methuen & Co., Ltd., London (1968), can also be used. Mixed compounds of noble metals may also be utilized.

Component (b) of the photopolymerizable composition comprises a photopolymerizable compound(s) which containing at least 50 percent of a polyfunctional acrylate derived from a polyol in which the hydroxyl groups are separated by at least three atoms. Preferably no more than 26 atoms separates the hydroxyl groups and preferably no more than 11 atoms separates the hydroxyl group. The compound is present in amounts ranging from 5–30 percent; a preferred range is 10–25 percent. This compound is, of course, a necessary component since upon exposure under ultraviolet light in the presence of a sensitizer, it polymerizes to form a hardened film. The most important aspect of this invention revolves around the discovery that the photopolymerizable compound must contain at least 50 percent of a polyfunctional acrylate derived from a polyol in which the hydroxyl groups are separated by at least three atoms. This provides for (1) the formation of a more suitable polymer network which produces shorter exposure times to ultraviolet light which ultimately produces highly resolved metal patterns and (2) an optimized polymer network which prevents wash-out of the organometallic compounds during the development stage, thereby increasing yield. If there are less than 3 atoms separating the hydroxyl groups in the parent polyol or if methacrylates rather than acrylates are used, the above advantages are not obtained. Consequently, at least 50 percent of the polymerizable compound must be the above specified polyfunctional acrylate. It is pointed out that the term "atoms" includes any of the common chemical atoms which are present in an acrylate system (e.g., carbon, oxygen).

The polymerizable compound system may comprise a suitable diacrylate, a triacrylate or a tetra-acrylate in admixture with each other and/or not more than 50 percent of other photopolymerizable monomers including acrylates and corresponding methacrylates. Typical polyfunctional acrylates derived from a polyol in which the hydroxyl groups are separated by at least three atoms include tetraethyleneglycol diacrylate, diethyleneglycol diacrylate, triethyleneglycol diacrylate, pentaerythritol triacrylate, 1,3-butanediol diacrylate, 1,4-butanediol diacrylate, 1,10-decamethyleneglycol diacrylate, 2,2-dimethylpropane diacrylate, 1,6-hexanediol diacrylate, pentaerythritol tetraacrylate, polyethyleneglycol diacrylate, 1,3-propanediol diacrylate, trimethylolpropane triacrylate, and tripropyleneglycol diacrylate. Also usable as a polyfunctional acrylate is the product Polyethylene Glycol Diacrylate 400 sold by Sartomer Company of West Chester, Pa. This represents a diacrylate mixture having an average molecular weight of about 400 where the diacrylate is made from polyethylene glycols of differing lengths. The average separation of the hydroxyl groups in the polyethylene glycol mixture is about 26 atoms. Optional monomers include trimethylol ethane trimethacrylate, ethylene glycol dimethacrylate, triethylene glycol dimethacrylate, ethylene diacrylate and mixtures thereof. It should be noted that small amounts of polymers may also be present initially. However, it is necessary to start with substantial amounts of polyfunctional compound so that polymeric formation and chain extension occurs in situ.

Component (c) of the composition is a sensitizer. The sensitizer absorbs energy from the ultraviolet light and catalyzes and/or enters into the polymerization reaction. This invention is not to be based upon any particular theory, and the exact function of the sensitizer is not fully understood. However, sensitizers are well known in the art and are discussed in "Radical Polymerization," J. C. Bevington, Academic Press, N.Y., (1961), pages 26–28. Typical sensitizers include tertiary butyl anthraquinone, benzoin methyl ether, 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,-10-tetrahydronaphthacenequinone, and 1,2,3,4-tetrahydrobenz(a)anthracene-7,12-dione, and mixtures thereof. The amount of sensitizer may range from 0.5–10 percent while a preferred range is from 1–5 percent.

An organosulfur compound (d) is desirable for increasing adhesion and smoothness of the metal film. Generally, from up to 60% by weight of an organosulfur compound may be present with a preferred range being 2–10 percent. Some sulfur may be provided by component (a) of the photopolymerizable composition, but this is usually not a sufficient amount and therefore, an additional organosulfur compound is required. In particular, organosulfur compounds from the group consisting of sulfurized terpenes, thiopenes or mercaptides with boiling points in excess of 220°C. are preferred. The well-known sulfurized damar resin has been very effectively utilized.

The fifth component (e), a flux, is optional; it may be present in amounts ranging from 0–50 percent by weight; a preferred range is 5–40 percent. The particular flux used is largely a matter of choice and depends somewhat upon the type of material to be coated. A number of fluxing materials which will enhance conductivity, adhesion, and brilliance of the metallic films are known in the art. For example, salt and resinates of bismuth, cadmium, lead, copper, cobalt, antimony, uranium, iridium, rhodium, vanadium, chromium and tin may be used for these purposes. Any of the fluxes heretofore used in the art to promote proper appearance and adherence, many of which are commercially available, may be used to likewise promote the solubility of the flux in the silvent system. A number of fluxes are usually needed in combination with each other to produce the most satisfactory results in the ultimate fired metallic films.

The sixth component (f), a polymerized ester, is also optional; it may be present in amounts ranging from 0–15 percent by weight. Any of the well-known polymeric esters may be used and particularly suitable are those disclosed in assignee's Schoenthaler U.S. Ser. No. 451,300, filed Apr. 27, 1965. Typical polymeric esters include poly (methyl methacrylate/acrylonitrile/acrylated glycidyl acrylate, 65/10/25), poly (methyl methacrylate/butyl methacrylate/acrylated glycidyl methacrylate, 1/1/1) and poly (methyl methacrylate/itaconic acid, 19/1).

The particular solvent or mixture of solvents used for the constituents of the photopolymerizable compositions is a matter of choice depending upon the method of application used, for example, whether the composition is to be applied by a stamping operation, by a painting operation, or by means of a squeegee through a screen. The different solvents used will impart to the composition differences in interfacial tension, surface tension, evaporation rate, viscosity, etc. As a consequence, different solvents and mixtures of solvents which impart specific application characteristics to the gold decorating compositions may be used for any particular purpose. Furthermore, different solvents and mixtures of solvents are recommended for different methods of application. Typical solvents usable in this invention, alone or as mixtures, include: methyl ethyl ketone, cyclohexanone, ethyl acetate, amyl acetate, Cellosolve, butanol, nitrobenzene, benzene, toluene, xylene, petroleum ether, the Freons, chloroform, carbon tetrachloride, trichloroethylene, perchloroethylene, various terpenes, such as pinene, dipentene, dipentene oxide, and the like essential oils, such as oils of lavendar, rosemary, aniseed, sassafras, wintergreen, fennel and turpentine, various rosins and balsams, and synthetic resins.

The photopolymerizable composition is formulated by dissolving the constituents in a suitable solvent. This may require various heating and/or stirring procedures which are well known in the art. After the composition is prepared, it can be applied by conventional techniques to a suitable substrate. Any of the well known dielectric substrates may be used, including alumina, glass, barium titanate, sapphire, berylia, steatite, fosterite, zircon and ferrites. Also, semiconductors (e.g., silicon, germanium) and/or temperature resistant plastics (e.g., polyimides) may be used as the substrate.

In a typical process, a drop of the photopolymerizable composition is placed on a substrate and spun by centrifugal force out towards the periphery of the substrate. The film is dried and then placed in a vacuum or inert gas frame (argon or nitrogen) in close contact with a mask having the desired pattern. However, prior to exposure through the mask, it can be advantageous to briefly expose the entire film surface to ultraviolet light. This has the effect of consuming polymerization inhibiting agents (e.g., oxygen) prior to the definition of the pattern through the mask. It is preferred that the face plate (cover sheet) of the vacuum or inert gas frame be a good transmitter of ultraviolet light in the range of 2,000–4,000 angstroms. Fluorinated polymers (e.g., fluorinated ethylene-propylene copolymer) are particularly useful. As to the mask used, it can be any of the conventional masking techniques including photoemulsion film masks, photoemulsion on glass, metal on glass or mechanical masks.

The next step involves exposing the mask substrate to 200–1500 watts of ultraviolet light for times of from a few seconds to several hours at a suitable distance. The polyfunctional acrylates permit short exposure times, generally from 1–10 minutes. A suitable source of ultraviolet light is a high pressure mercury arc. It may be necessary to cool the substrate by air streams or circulating water because the heat generated will cause sticking of the coated film to the mask and have adverse hardening effects on the film.

After exposure, the film is developed applying suitable solvent to wash away the undeveloped, unpolymerized, unhardened portions of the film. This can be done by immersion, spraying, brushing or any of the well-known techniques. Suitable solvents for this purpose include carbon tetrachloride, chloroform, isobutyl alcohol, trichloroethylene, perchloroethylene, tetrachloroethylene, the Freons (chlorinated-fluorinated hydrocarbons), and mixtures thereof.

The developed image is dried by blowing with a stream of air as quickly as possible after development. Then the substrate is fired to produce the metallic film and cause it to adhere firmly to the substrate. The typical procedure is to bring the temperature of the substrate from room temperature to peak temperature (e.g., 800°C.) in 30–50 minutes; the peak temperature is held for a few minutes and the substrate is then removed and cooled for five minutes. Good ventilation to remove the organic decomposition products is necessary.

The finished circuit consists (if it is a conductor pattern) of precious metal films, specularly reflecting light, with low resistivities and of a thickness ranging from 0.05–5 microns. The adherent films may be solderable, thermal compression bondable or ultrasonic bondable.

Resistors can also be made from these photopolymer compositions. For example, resinates of palladium and silver can be used as the organic noble metal compounds. By varying the ratio of palladium and silver, the resistances may also be tailor-made up to ten megohms/square.

The invention is illustrated by the following examples. In the examples and elsewhere in the specification, all parts, ratios and percentages of materials or components are by weight.

Various photopolymerizable compositions were prepared by dissolving the solid constituents in a suitable solvent in varying proportions as set forth in Table I. The dissolving step was carried out under a dim amber light while the mixture was stirred with a magnetic stirrer for several hours without external heating.

Several drops of the photopolymerizable composition where placed in the center of a glazed alumina chip (1″ × 1″ × 25 mils thick). The chip was spun at 2,500 rpm. for three seconds to distribute the composition evenly over the ceramic surface. The chip was dried in vacuum at room temperature for 15 minutes, and then at 50°C. in air for 15 minutes. A negative film mask having a fine line pattern was placed in firm contact with the coated chip in a vacuum frame with a 5 mil thick fluorinated ethylene-propylene face plate. A vacuum held the assembly in close registry and excluded oxygen. The chip was then exposed to intense ultraviolet light from a 1,200 watt, high-pressure mercury arc source at a distance of 10 inches for 10 minutes. The vacuum frame incorporated a cooling device with circulating water as the cooling medium. The substrate was removed from the vacuum frame and developed by spraying the surface with a 50/50 by volume mixture of carbon tetrachloride and Freon 113 for 30 seconds. When development was complete, the developing mixture was rapidly evaporated by a stream of air. The chip was then heated from 20°C. to 750°C. in about 45 minutes to burn out the organics and deposit the metals in an adherent, coherent, electrically conductive film.

The resolution of the fine line conductor pattern was rated. An "Excellent" (EX) rating was given if 0.1–0.5 mil lines with 0.1–0.5 mil separation were clearly resolved; a "good" rating was given if 0.6–1 mil lines with 0.6–1 mil separation were clearly resolved, a "poor" rating was given if 1 mil lines with 1 mil separation were not clearly resolved.

The adhesion was rated as excellent if no metal was removed after scraping with a knife; a good rating was assigned is some metal was removed; a poor rating was given if most or all of the metal was removed.

In order to test the solderability, the coated chips were immersed in a Sn/Pb solder (60–40) at 215°C. for two seconds. The coating of solder was deposited on the metallized portions of the chip. The solderability was deemed to be excellent if the metal pattern was uniformly covered with solder with no solder bridging between adjacent lines.

The resistance was determined before soldering and after soldering (tinned). These values are also reported in Table I. The entry for Total Solids is used to mean all constituents other than the added trichloroethylene solvent.

TABLE I

| Example | (Weight Percent) 1 | 2 | 3 | 4 |
|---|---|---|---|---|
| Pinene mercaptide Pt (34.5% Pt) | 23.6 | 23.6 | 23.6 | 19.9 |
| Pinene mercaptide Au (50% Au) | 23.6 | 23.6 | 23.6 | 19.9 |
| Tetraethyleneglycol diacrylate | 6.7 | | | |
| Diethyleneglycol diacrylate | 10.0 | 16.7 | | |
| Triethyleneglycol diacrylate | | | 8.4 | |
| Pentaerythritol triacrylate | | | 8.4 | 8.2 |
| Ethyleneglycol dimethacrylate | | | | 8.2 |
| Tertiary butyl anthraquinone | 2.6 | 2.6 | 2.6 | 2.6 |
| Sulfurized damar resin | 3.4 | 3.4 | 3.3 | 3.2 |
| Rhodium resinate (3% Rh) | 10.0 | 10.0 | 10.0 | 15.0 |
| Bismuth resinate (5% Bi) | 11.7 | 11.7 | 11.7 | 11.5 |
| Vanadium resinate (6% V) | 8.4 | 8.4 | 8.4 | 11.5 |
| Total Solids | 53.8 | 53.8 | 53.8 | 54.7 |
| Trichlorethylene | 46.2 | 46.2 | 46.2 | 45.3 |
| Resolution | Ex. | Ex. | Good | Ex. |
| Adhesion | Ex. | Ex. | Ex. | Ex. |
| Resistance (ohms/square) | 6 | 8 | 6 | 10 |
| Solderability | Ex. | Ex. | Ex. | Ex. |
| Tinned Resistance (ohms/square) | .075 | .115 | .130 | .125 |

What is claimed is:

1. A photopolymerizable composition for producing high yields of highly resolved noble metal patterns comprising on organic solvent having constituents dissolved therein, wherein said constituents comprise:

a. 5–85 percent, by weight, of an organic noble metal compound; 0 b. 5–30 percent, by weight, of a photopolymerizable compound(s) containing at least 50 percent of a polyfunctional acrylate derived from a polyol in which the hydroxyl groups are separated by at least three atoms;

c. 0.5–10 percent, by weight, of an organic sensitizer;

d. 0–60 percent, by weight, of organosulfur compound(s);

e. 0–50 percent, by weight, of a flux; and f. 0–15 percent, by weight, of a polymeric ester.

2. A composition in accordance with claim 1 in which said polyfunctional acrylate is derived from a polyol in which the hydroxyl groups are separated by no more than an average of about 26 atoms.

3. A composition in accordance with claim 2 in which said polyfunctional acrylate is derived from a polyol in which the hydroxyl groups are separated by no more than 26 atoms.

4. A composition in accordance with claim 3 in which said polyfunctional acrylate is derived from a polyol in which the hydroxyl groups are separated by no more than 11 atoms.

5. A composition in accordance with claim 2 wherein the polyfunctional acrylate derived from a polyol in which the hydroxyl groups are separated by at least three atoms is from the group consisting of a diacrylate, a triacrylate, a tetraacrylate and mixtures thereof.

6. A composition in accordance with claim 5 wherein the photopolymerizable compounds also contains at least one compound selected from the group consisting of acrylates, methacrylates, and mixtures thereof.

7. A composition in accordance with claim 2 wherein the organic sensitizer is selected from the group consisting of tertiary butyl anthraquinone, benzoin methyl ether and mixtures thereof.

8. A composition in accordance with claim 2 wherein the organosulfur compound is sulfurized damar resin.'

9. A composition in accordance with claim 2 wherein the flux is selected from the group consisting of rhodium resinate, bismuth resinate, vanadium resinate and mixtures thereof.

10. A substrate having the composition of claim 2 coated thereon.

* * * * *